(12) United States Patent
Ash et al.

(10) Patent No.: US 6,778,577 B2
(45) Date of Patent: Aug. 17, 2004

(54) SEMICONDUCTOR LASER

(75) Inventors: Richard Mark Ash, Bury St Edmunds (GB); Christopher Anthony Park, Stowmarket (GB)

(73) Assignee: Agilent Technologies, Inc., Palo Alto, CA (US)

( * ) Notice: Subject to any disclaimer, the term of this patent is extended or adjusted under 35 U.S.C. 154(b) by 40 days.

(21) Appl. No.: 10/348,142

(22) Filed: Jan. 21, 2003

(65) Prior Publication Data
US 2003/0142709 A1 Jul. 31, 2003

(30) Foreign Application Priority Data

Jan. 23, 2002 (EP) .......................................... 02250465

(51) Int. Cl.$^7$ ............................................... H01S 5/00
(52) U.S. Cl. .......................................... 372/50; 372/20
(58) Field of Search ............................. 372/20, 32, 36, 372/43–50

(56) References Cited

U.S. PATENT DOCUMENTS

| | | | | |
|---|---|---|---|---|
| 3,676,795 A | * | 7/1972 | Pratt, Jr. ........................ | 372/28 |
| 4,935,935 A | * | 6/1990 | Reed et al. ..................... | 372/44 |
| 6,470,036 B1 | * | 10/2002 | Bailey et al. ................... | 372/20 |
| 6,580,736 B1 | * | 6/2003 | Yoshie et al. .................. | 372/45 |

FOREIGN PATENT DOCUMENTS

JP 2000031603 1/2000 ............. H01S/5/30

OTHER PUBLICATIONS

Claessen, L., Examiner. European Search Report, Application No. EP 02 25 0465, dated Jan. 15, 2003.

Ebeling, K.J. "Tunable Single–Longtudinal Mode Emission of Semiconductor Lasers," vol. 16, No. 3, Sep. 1, 1984, pp. 176–186, XP000712300.

Shin K–C et al., "Low Threshold Current Density Operation of GAINASP–INP Laser With Multiple Reflector Microcavities," IEEE Photonics Technology Letters, New York, vol. 7, No. 10, Oct. 1, 1995, pp. 1119–1121, XP000537212.

Hung C Y et al. "Piezoelectrically Induced Stress Tuning Of Electro–Optic Devices," Applied Physics Letters, New York, vol. 59, No. 27, Dec. 20, 1991, pp. 3598–3600, XP000257112.

Cohen D A et al., "Temperature Compensation Of The Threshold Current, Differential Efficiency, and Refractive Index . . . , " Electronics Letters, vol. 32, No. 24, Nov. 21, 1996, pp. 2245–2247, XP006005988.

* cited by examiner

*Primary Examiner*—Quyen Leung

(57) ABSTRACT

Controlling or stabilising the lasing wavelength of a source of laser radiation, wherein the source of laser radiation comprises a semiconductor material laser, a substrate to which the laser is mounted, a resonant optical cavity within the semiconductor material, the cavity having an active medium for generating laser radiation and one or more gaps in the semiconductor material within the cavity, wherein the substrate is deformable by the application of a mechanical stress to vary the size of the gap(s) in order to change the optical size of the gap(s) and hence to vary the wavelength of laser radiation generated by the semiconductor laser.

19 Claims, 1 Drawing Sheet

SEMICONDUCTOR LASER

FIELD OF THE INVENTION

The present invention relates to the control or stabilisation of the lasing wavelength of a source of laser radiation, particularly the wavelength stabilisation of a semiconductor laser source.

DISCUSSION OF THE BACKGROUND ART

The wavelength of laser radiation generated by semiconductor lasers needs to be stabilised in many applications, for example when the laser radiation is used in Wavelength Division Multiplexing (WDM) systems, where different wavelengths launched into a fibre must have tightly controlled wavelengths so as not to interfere one another. WDM systems may carry a number of channels with different wavelengths around 800 nm to 1600 nm, separated by about 20 nm. More recently, Dense Wavelength Division Multiplexing (DWDM) systems have appeared where channel separation is less than or about 2 nm.

A high degree of wavelength stabilisation is also useful in erbium-doped fibre amplification systems. Here, the wavelength of the pump laser needs to be tightly controlled to match the absorption characteristics of the erbium-doped fibre. See, for example, the disclosure in patent document U.S. Pat. No. 6,144,788.

Laser wavelength can change owing to ageing effects or from unwanted optical feedback into the laser resonant cavity. In many applications the temperature of the laser device can vary, for example due to varying electrical power dissipation within the device, or because of changes in ambient temperature. Temperature changes will, in general, affect the laser wavelength, for example by changing the optical length of the resonant cavity or by changing the gain characteristics of the lasing medium.

There is a particular problem with distributed feedback (DFB) lasers and other semiconductor lasers where a wavelength selective element or grating is buried in the semiconductor material, in that the grating pitch can change with temperature owing to a change in length of the device itself due to thermal expansion and changes in refractive index with temperature or ageing. In DWDM systems, tight control of each laser wavelength is a prerequisite for reliable system operation. Usually, such systems use fixed wavelength DFB lasers whose emission wavelength is controlled by the use of a temperature sensing element and a thermocooler. However, such active thermoelectric cooling of the semiconductor laser is expensive and inconvenient, and increases electrical power consumption and is not absolute.

One way of stabilising the lasing wavelength of a source of laser radiation, particularly a laser diode, is to couple the output from the laser into an optical fibre pigtail having a grating. Such gratings are normally alternating bands of relatively high and low index of refraction, aligned transversely to the propagation direction of the laser radiation within the fibre. The grating is fabricated to selectively reflect a particular characteristic wavelength within the fibre back to the laser source. If the amount of the optical feedback is sufficient, then the wavelength of the laser diode can be stabilised against fluctuations owing to temperature variations of the laser, short-term power variations, or long-term ageing effects.

Such fibre pigtail assemblies, however, require precision assembly and are relatively expensive to manufacture.

SUMMARY OF THE INVENTION

It is an object of the present invention to provide a more convenient method and apparatus for stabilising the wavelength of a source of laser radiation.

Accordingly, the invention provides a source of laser radiation, comprising a semiconductor material laser, a substrate to which the laser is mounted, a resonant optical cavity within the semiconductor material, the cavity having an active medium for generating laser radiation and one or more gaps in the semiconductor material within the cavity, wherein the substrate is deformable by the application of a mechanical stress to vary the size of said gap(s) in order to change the optical size of said gap(s) and hence to vary the wavelength of laser radiation generated by the semiconductor laser.

The semiconductor material may be a III–V material, for example formed from InP, and the active medium may be a quaternary semiconductor bulk or quantum well material.

The ability to vary the size of the gaps by the application of a mechanical stress to the substrate permits the generated wavelength to be controlled over a certain wavelength range, and this in turn allows the wavelength either to be stabilised to a particular value, or to be tuned over a certain range of wavelengths.

Therefore, the invention also provides a wavelength stabilised laser unit, comprising a source of laser radiation for generating wavelength-stabilised laser radiation, wherein the laser source is according to the invention.

The gaps may also cause the cavity to operate in a single longitudinal mode, particularly if there are a plurality of said gaps. This is particularly advantageous, as the gaps then fulfil two functions: both wavelength control or stabilisation and single wavelength selection.

The substrate may be a semiconductor material, a metal, a ceramic, or any other suitable material.

The gaps may be changed either passively, or actively under the action of an actuator, which may be controlled by a controller.

The stress may therefore be applied in a variety of ways. In one embodiment, the source may comprise a piezoelectric actuator arranged to apply said mechanical stress to the substrate. The applied stress may then cause the substrate and semiconductor laser to bow and hence vary the size of said gap(s).

Another way of applying the stress is by thermal expansion or contraction of the substrate and/or laser diode when the temperature of the substrate changes. For example, the substrate and semiconductor material may have differential coefficients of thermal expansion which are sufficient to cause the substrate and semiconductor laser to bow upon application of the mechanical stress. The bowing then causes the size of said gap(s) to vary.

The variation in the size of said gap(s) caused by said expansion or contraction of the substrate and/or semiconductor laser may, in some applications, be used to stabilise the wavelength of laser radiation generated by the semiconductor laser against changes owing to temperature variation or ageing of the semiconductor laser.

In either embodiment, the optical cavity may be between 100 $\mu$m and 500 $\mu$m long. The bowing of the semiconductor laser may then have a radius of between 30 mm and 120 mm at a first temperature, and essentially no bowing at a second temperature, said first and second temperatures being separated by about 100° C.

A typical length of the gaps is between 0.2 and 2.0 $\mu$m extending in a longitudinal direction with respect to the cavity.

A typical depth of the gaps is between 1 and 10 μm deep in a direction transverse to a longitudinal direction with respect to the cavity.

In a preferred embodiment of the invention, the wavelength stabilised laser unit may comprise a controller for stabilising the wavelength of laser radiation generated by the laser source, and an actuator for applying a mechanical stress to the substrate. The actuator is then responsive to the controller in order to deform the substrate and so vary the size of said gap(s) and hence to stabilise the wavelength of laser radiation generated by the semiconductor laser.

The controller may be linked to a temperature sensor for sensing the temperature of the semiconductor laser and arranged to control the actuator in response to the temperature sensor in order to stabilise said wavelength.

The controller may be linked to a device directly measuring the laser wavelength such as a wavemeter, a wavelength sensitive filter, a spectrometer or other device which measures wavelength directly.

The invention also provides a method of varying the wavelength of a source of laser radiation, said source comprising a semiconductor material laser, a substrate to which the laser is mounted, a resonant optical cavity within the semiconductor material, the cavity having an active medium, and one or more gaps in the semiconductor material within the cavity, wherein the method comprises the steps of:

i) using the active medium to generate laser radiation;
ii) using said gap(s) to selectively apply feedback within the cavity to one or more particular wavelengths;
iii) deforming the substrate by the application of a mechanical stress to vary to size of said gap(s) and hence to vary the wavelength of laser radiation generated by the semiconductor laser.

The invention further provides a method of stabilising the wavelength of a laser unit, the laser unit comprising a semiconductor material laser, a substrate to which the semiconductor laser is mounted, a resonant optical cavity within the semiconductor material, the cavity having an active medium and one or more gaps in the semiconductor material within the cavity, a controller for stabilising the wavelength of laser radiation generated by the semiconductor laser, and an actuator for applying a mechanical stress to the substrate, wherein the method comprises the steps of:

i) using the active medium to generate laser radiation;
ii) using said gap(s) to selectively apply feedback within the cavity to one or more particular wavelengths of said radiation;
iii) controlling the actuator with the controller to deform the substrate by the application of said mechanical stress to vary to size of said gap(s) and hence to stabilise the wavelength of laser radiation generated by the semiconductor laser.

The semiconductor laser may be a vertical cavity structure, but the invention is particularly applicable to a horizontal cavity structure, such as an edge-emitting buried heterostructure device, owing to the fact that gaps can more readily be formed with such a device, for example by etching downwards into the laser structure from an exposed upper surface of the horizontal device.

BRIEF DESCRIPTION OF THE DRAWINGS

The invention will now be described in further detail and by way of example only, with reference to the accompanying drawings, in which.

DETAILED DESCRIPTION OF THE PREFERRED EMBODIMENT

Figure 1:
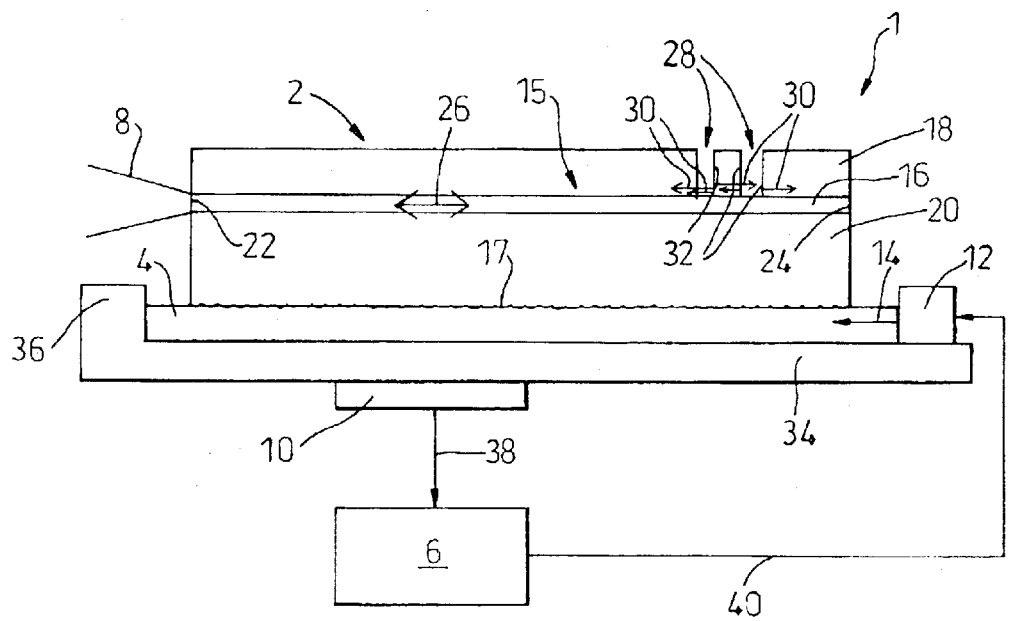
FIG. 1 is a side schematic view of a wavelength stabilised laser unit according to one embodiment of the invention.

FIG. 1 shows a side schematic view of a wavelength stabilised laser unit 1, having a semiconductor laser source 2 formed in InP/InGaAsP, a substrate 4 to which the semiconductor laser 2 is mounted, a controller 6 for stabilising the wavelength of laser radiation 8 generated by the laser source 2, a temperature sensor 10, and a piezo-electric actuator 12 for applying a mechanical stress 14 to the substrate 4. Not shown for clarity are electrical connections to the laser source for driving the laser.

The semiconductor laser source 2 is permanently and rigidly affixed to the substrate 4, for example by affixing with a rigid bonding means 17. For example, the semiconductor laser source 2 can be rigidly bonded to the substrate material 4 by using a AuSn solder, by Au thermocompression bonding, or other known means.

In order to prevent or minimise bowing of this bonded structure 2,4 caused by temperature changes, the laser source 2 and substrate 4 are preferably formed from materials having the same or a similar coefficient of thermal expansion. Optionally, the substrate 4 may be integrally formed in the same material with the laser source 2, for example by cutting the device from a processed wafer of semiconductor material with a substrate that is thick enough so that the actuator 12 can apply the stress 14 to the substrate 4.

The laser source 2 may be either a stripe laser or a buried heterojunction device, for example having a gain-guided resonant cavity 15 formed by a planar active medium 16 bounded by an upper semiconductor layer 18, a lower semiconductor layer 20, and opposite reflecting end facets 22,24 that reflect generated laser radiation 26 within the cavity 15. One end facet 22 is partially transmitting to allow laser radiation 8 to be emitted by the laser source 2, although the other end facet 24 may be partially transmitting or fully reflecting, depending on the application for the laser source 2.

The emitted laser radiation may be visible or invisible radiation, particularly near infra-red laser radiation.

A series of gaps 28 are etched in the upper semiconductor layer 18 towards the active layer 16. In this example, the gaps are filled with air, but it would be possible to fill the gaps with a transparent material as long as there was a sufficient difference in refractive index between such a transparent material and the semiconductor material of the upper semiconductor layer 18.

One way in which the size of the gaps 28 can be used to vary or to control and stabilise the wavelength of the laser radiation 26, is if changes in the size of the gaps 28 alters the effective optical length of the cavity 15. In this embodiment of the invention, however, the gaps 28 alter the gain within the cavity 15 by interference effects.

For clarity, only two such gaps are shown, but there may be up to 10 or more of such gaps. Even if the gaps 28 do not reach or penetrate the active layer 16, the gaps 28 will have an effect on laser radiation 26 within the resonant cavity 15, owing to modes of the radiation that extend some distance outside the active layer 16 into the upper semiconductor layer 18. In particular, reflections 30 from vertically extending surfaces 32 of the gaps 28 will cause constructive and destructive interference with longitudinal modes (not shown) in the laser cavity 15. The gaps 28 thus become part of the laser cavity 15. The longitudinal spacing of the vertical surfaces 32 of the gaps 28 will therefore affect the feedback within cavity 15 as a function of the wavelength of the generated laser radiation 26.

It is therefore possible to vary or select particular wavelengths by varying the spacing of the vertically extending surfaces 32. In the first embodiment 1, this is done by using the piezo-electric actuator 12 to apply a mechanical stress 14 to the substrate 4. The actuator is rigidly connected to a support 34 that underlies the laser substrate 4 and along which the substrate is free to slide in a longitudinal direction. The support has an end stop 36 that prevents the substrate as a whole moving in the longitudinal direction when the stress 14 is applied. The stress 14 therefore causes the substrate 4 to compress slightly in the longitudinal direction, and because the substrate 4 and semiconductor material 26,18,20 of the laser source 2 are rigidly bonded, the laser source also becomes slightly compressed in the longitudinal direction. This causes the spacing between the vertically extending surfaces 32 of the gaps 28 to become compressed, and the change in this spacing will then vary the wavelength of the generated laser radiation 8.

In this example, the temperature sensor 10 is joined to the support 34 and sends a signal 38 indicative of the temperature of the laser unit 2 to the controller 6, which may include a microprocessor. The controller 6 then outputs a control signal 40 to the actuator 12 to cause this to vary the wavelength as described above. By the use of a suitable control strategy, for example in software running in the controller 6, it is therefore possible to feed back to the actuator 12 a signal 40 that varies, that is, alters or stabilises, the wavelength of the generated laser radiation 26.

As an alternative to a temperature sensor 10, a direct reading of laser wavelength may be made using a wavelength sensing device such as a filter or wavelength meter (not shown). This measurement can then be used to provide an appropriate signal to the controller 6 to permit the temperature stabilisation feedback loop to work.

Figure 2:
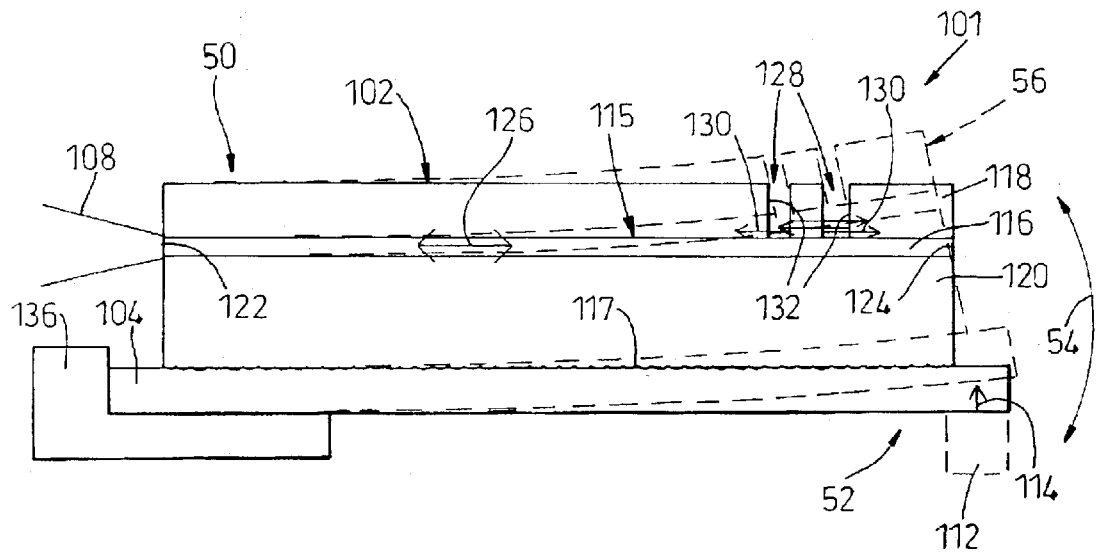
FIG. 2 is a side schematic view of a source of laser radiation according to another embodiment of the invention.

FIG. 2 shows a laser unit 101 according to another embodiment of the invention, in which features similar to those of the first embodiment 1 described above are indicated with similar reference numerals incremented by 100. As with the first embodiment, the gaps 128 may be etched into the laser structure 116,118,120, so that the gaps are in proximity with, or cut through, the active layer 116.

Unlike the first embodiment 1, the wavelength of generated laser radiation 126 is passively stabilised against temperature changes. There is therefore no need for a temperature sensor, actuator or controller, which simplifies the construction and cost of the laser source.

Here, the coefficient of thermal expansion of the substrate 102 is greater than the coefficient of thermal expansion of the semiconductor laser source 102. In addition, along most of the length of the laser source 102 and substrate 104, the laser source and substrate are free to move in a vertical direction transverse to the longitudinal direction of the resonant cavity 115. The substrate is permanently affixed by bonding means 117, as described above, to a truncated support 136 towards a forward bound end 50 of the substrate 104 and laser source 102, in order to stabilise the position and angle of the emitted laser radiation 108, which may need to be accurately set, for example with respect to collimating optics (not shown).

The other end 52 of the substrate 102 and laser source 102 is, however, relatively free to flex in a vertical direction so that this free end 52 of the unit 101 can pivot 54 about the support 136.

In this example, the resonance of the cavity 115 is changed by forming the substrate 104 from a material having a higher thermal expansion coefficient than the InP-based semiconductor material 116,118,120. Therefore, when the temperature of the unit 101 increases, the substrate 104 expands more than the laser source 102, causing the free end 52 of the unit 101 to pivot 54 upwards, as shown in phantom outline 56.

When the laser source flexes upwards in this way, the gaps 128 are compressed. Furthermore, because the gaps 128 are a point of local weakness in the structure of the laser source 102 (particularly when filled with air), this flexing is concentrated in the vicinity of the gaps 128, which therefore compress more than parts of the laser source away from the gaps 128.

EXAMPLE 1

A particular example will now be described for the second embodiment 101 of the invention.

The thermal expansion coefficient of InP is approximately $5 \times 10^{-6}$. Therefore, for a typical semiconductor laser diode 102 of 250 $\mu$m length, a temperature change of 100° C. will result in a total thermal expansion of the cavity 115 of about 125 nm. This will result in a shift in laser wavelength. In order to compensate for this change in length an air gap 128, d, would need to be compressed by the same amount multiplied by the refractive index of InP (3.4). This yields a required compression equivalent to 0.425 $\mu$m. For the wavelength to be stabilised, this compression would need to be applied monotonically as the temperature increased. Typically, laser diodes are 100 $\mu$m thick (in the vertical direction as drawn) and to generate a bowing of the laser such that the top surface containing the etched gaps 128 is compressed relative to the lower surface by 0.425 $\mu$m would require a radius of curvature of approximately 60 mm or a compressive strain of approximately 0.17%. To achieve this, any of a number of common metallic materials could be used as a substrate material 104 having a coefficient of thermal expansion of approximately $10 \times 10^{-6}$.

In this way a laser source can be manufactured where the longitudinal modes are passively stabilised as the temperature changes. Depending on the reflectivity from surfaces in the gaps, and the finesse of the overall cavity, the laser could be made operate on a single longitudinal mode in a similar manner to a DFB laser. This single longitudinal mode would also be temperature stabilised by this technique. The gap itself needs to be wide enough to be able to etch good quality deep facets but not too wide such that the optical loss caused by a diverging beam becomes too great. Typically the gap would be about 0.5 $\mu$m wide by about 5 $\mu$m deep, but other geometries may be used.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable combination. For example, the second embodiment 101 may optionally comprise an actuator 112 for applying a vertical stress 114 to the substrate 104 to cause the pivoting movement 54 of the semiconductor laser 102 and substrate 104.

The invention therefore provides for a laser source with a wavelength which is passively stabilised or actively stabilised against changes in ambient temperature, or operating temperature of the semiconductor laser. Such a laser is useful in DWDM systems, or other applications where control of emission wavelength over a wide temperature range is desirable. This is achieved by incorporation of a tuneable section composed of an etched gap structure.

The invention also permits the wavelength of a laser source to be varied or controlled. This is particularly useful when the laser wavelength needs to be tuned.

The invention can be used wherever the control or the stabilisation of the wavelength of a semiconductor laser is required. For example, the invention may be used in: a wavelength division multiplexing transmission system; a laser source for an optical sensor that requires a stabilised wavelength; or a reference source of stable wavelength for general engineering, chemical sensing, environmental sensing or scientific applications.

The invention therefore provides devices and methods for use of a wavelength controlled or wavelength stabilised semiconductor laser which offers low cost manufacture, ease of use and the possibility of operating without thermoelectric cooling for lower electrical power consumption.

What is claimed is:

1. A source of laser radiation, comprising a semiconductor material laser, a substrate to which the laser is mounted, a resonant optical cavity within the semiconductor material, the cavity having an active medium for generating laser radiation and one or more gap(s) in the semiconductor material within the cavity, wherein the substrate is deformable by the application of a mechanical stress to vary the size of said gap(s) in order to change the optical size of said gap(s) and hence to vary the wavelength of laser radiation generated by the semiconductor laser.

2. A source of laser radiation as claimed in claim 1 comprising a piezo-electric actuator arranged to apply said mechanical stress to the substrate.

3. A source of laser radiation as claimed in claim 2, in which the piezo-electric actuator is arranged to cause the substrate and semiconductor laser to bow and hence vary the size of said gap(s).

4. A source of laser radiation as claimed in claim 1, in which said mechanical stress is provided by thermal expansion or contraction of the substrate and/or laser when the temperature of the substrate changes.

5. A source of laser radiation as claimed in claim 4, in which the substrate and semiconductor material have differential coefficients of thermal expansion, said differential coefficients of expansion being sufficient to cause the substrate and semiconductor laser to bow upon application of the mechanical stress, said being then causing the size of said gap(s) to vary.

6. A source of laser radiation as claimed in claim 4 or claim 5, in which the variation in the size of said gap(s) caused by said expansion or contraction of the substrate and/or semiconductor laser acts to stabilise the wavelength of laser radiation generated by the semiconductor laser against changes owing to temperature variation.

7. A source of laser radiation as claimed in claim 4, in which the coefficient of thermal expansion of the substrate is greater than the coefficient of thermal expansion of the semiconductor laser.

8. A source of laser radiation as claimed in claim 3, in which the optical cavity is between 100 $\mu$m and 500 $\mu$m long, and the bowing of the semiconductor laser has radius of between 30 mm and 120 mm at a first temperature, and essentially no bowing at a second temperature, said first and second temperatures being separated by about 100° C.

9. A source of laser radiation as claimed in claim 1, in which said gap(s) cause the cavity to operate in a single longitudinal mode.

10. A source of laser radiation as claimed in claim 1, in which there are a plurality of said gaps.

11. A source of laser radiation as claimed in claim 1, in which the or each gap extends be seen 0.2 and 2.0 $\mu$m in a longitudinal direction with respect to the cavity.

12. A source of laser radiation as claimed in claim 1, in which the or each gap is between and 10 $\mu$m deep in a direction transverse to a longitudinal direction with respect to the cavity.

13. A wavelength stabilised laser unit, comprising a source of laser radiation for generating wavelength-stabilised laser radiation, wherein the laser source comprising a semiconductor material laser, a substrate to which the laser is mounted, a resonant optical cavity within the semiconductor material, the cavity having a active medium for generating laser radiation and one or more gap(s) in the semiconductor material within the cavity, wherein the substrate is deformable by the application of a mechanical stress to vary the size of said gap(s) in order to change the optical size of said gap(s) and hence to vary the wavelength of laser radiation generated by the semiconductor laser.

14. A wavelength stabilised laser unit, comprising a semiconductor material laser, a substrate to which the semiconductor laser is mounted, a resonant optical cavity within the semiconductor material, the cavity having an active medium for generating laser radiation and one or more gaps in the semiconductor material within the cavity, a controller for stabilising the wavelength of laser radiation emitted by the laser source, and an actuator for applying a mechanical stress to the substrate, wherein the actuator is responsive to the controller in order to deform the substrate and so vary the size of said gap(s) and hence to stabilise the wavelength of laser radiation generated by the semiconductor laser.

15. A laser unit as claimed in claim 14, in which the controller is linked to a temperature sensor for sensing the temperature of the semiconductor laser, wherein the controller is arranged to control the actuator in response to the temperature sensor in order to stabilise said wavelength.

16. A laser unit as claimed in claim 14, in which the actuator is a piezo-electric actuator arranged to apply said mechanical stress to the substrate.

17. A source of laser radiation as claimed in claim 16, in which the piezo-electric actuator is arranged to cause the substrate and semiconductor laser to bow and hence vary the size of said gap(s).

18. A method of varying the wavelength of a source of laser radiation, said source comprising a semiconductor material laser, a substrate to which the laser is mounted, a resonant optical cavity within the semiconductor material, the cavity having a active medium, and one or more gaps in the semiconductor material within the cavity, wherein the method comprises the steps of:

i) using the active medium to generate laser radiation;
   ii) using said gap(s) to selectively apply feedback within the cavity to one or more particular wavelengths
   iii) deforming the substrate by the application of a mechanical stress to vary to size of said gap(s) and hence to vary the wavelength of laser radiation generated by the semiconductor laser.

19. A method of stabilising the wavelength of a laser unit, the laser unit comprising a semiconductor material laser, a substrate to which the semiconductor laser is mounted, a resonant optical cavity within the semiconductor material, the cavity having an active medium and one or more gaps in the semiconductor material within the cavity, a controller for stabilising the wavelength of laser radiation generated by the semiconductor laser, and an actuator for applying a mechanical stress to the substrate, wherein the method comprises the steps of:

i) using the active medium to generate laser radiation;
ii) using said gap(s) to selectively apply feedback within the cavity to one or more particular wavelengths of said radiation;
iii) controlling the actuator with the controller to deform the substrate by the application of said mechanical stress to vary to size of said gap(s) and hence to stabilise the wavelength of laser radiation generated by the semiconductor laser.

* * * * *